United States Patent
Lee et al.

(10) Patent No.: US 8,190,968 B2
(45) Date of Patent: *May 29, 2012

(54) SEMICONDUCTOR MEMORY DEVICE AND DATA ERROR DETECTION AND CORRECTION METHOD OF THE SAME

(75) Inventors: Kwang-Jin Lee, Hwaseong-si (KR); Won-Seok Lee, Suwon-si (KR); Du-Eung Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/099,640

(22) Filed: May 3, 2011

(65) Prior Publication Data

US 2011/0209030 A1    Aug. 25, 2011

Related U.S. Application Data

(63) Continuation of application No. 11/773,214, filed on Jul. 3, 2007, now Pat. No. 7,949,928.

(30) Foreign Application Priority Data

Nov. 3, 2006  (KR) .......................... 10-2006-0108422

(51) Int. Cl.
*H03M 13/00* (2006.01)

(52) U.S. Cl. .......... 714/758; 714/801; 714/42; 714/718; 365/185.09

(58) Field of Classification Search .................. 714/758, 714/801, 42, 718; 365/185.09
See application file for complete search history.

(56) References Cited

U.S. PATENT DOCUMENTS

| | | | | |
|---|---|---|---|---|
| 5,477,492 A | * | 12/1995 | Ohsaki et al. | 365/200 |
| 6,373,748 B2 | * | 4/2002 | Ikehashi et al. | 365/185.22 |
| 6,957,378 B2 | * | 10/2005 | Koga et al. | 714/763 |
| 7,051,260 B2 | * | 5/2006 | Ito et al. | 714/754 |
| 7,318,183 B2 | * | 1/2008 | Ito et al. | 714/754 |
| 7,325,173 B2 | * | 1/2008 | Kikutake et al. | 714/703 |
| 7,464,315 B2 | * | 12/2008 | Ito et al. | 714/754 |

* cited by examiner

*Primary Examiner* — Esaw Abraham
(74) *Attorney, Agent, or Firm* — F. Chau & Associates, LLC

(57) ABSTRACT

A semiconductor memory device includes a memory cell array, a mode setting circuit, a parity data generation unit, and a data error detection and correction unit. The memory cell array has a plurality of first memory banks for storing normal data, and a predetermined number of second memory banks less than the number of the first memory banks for storing parity data according to control of a first flag signal. The mode setting circuit sets the first flag signal and a second flag signal controlling based on whether a separate memory bank is used to store the parity data in the second memory banks. The parity data generation unit receives normal write data during a write operation, generates parity data with respect to the normal write data in response to the second flag signal, and outputs the normal data and the parity data. The data error detection and correction unit receives normal read data and parity read data read from the memory cell array during a read operation, detects errors of the normal read data in response to the second flag signal, corrects the normal read data when the errors are detected, and outputs the corrected read data.

20 Claims, 4 Drawing Sheets

SEMICONDUCTOR MEMORY DEVICE AND DATA ERROR DETECTION AND CORRECTION METHOD OF THE SAME

CROSS-REFERENCE TO RELATED APPLICATION

This application is a continuation of U.S. application Ser. No. 11/773,214 filed on Jul. 3, 2007, which issued as U.S. Pat. No. 7,949,928 and claims priority to Korean Patent Application No. 10-2006-0108422, filed on Nov. 3, 2006, the disclosures of which are incorporated by reference in their entirety herein.

BACKGROUND OF THE INVENTION

1. Technical Field

The present disclosure relates to a semiconductor memory device, and more particularly, to a semiconductor memory device which allocates memory banks having memory cells storing data for detecting data errors, correcting data errors, and enhancing the yield of a semiconductor chip.

2. Discussion of the Related Art

Rapid progress in semiconductor technology development has resulted in high integration and high performance semiconductor integrated circuits, and in particular, remarkably high integration has been attained in the field of semiconductor memory devices.

However, due to the high performance of a semiconductor integrated circuit, when the size of the semiconductor chip increases, the yield of the semiconductor chip decreases in proportion to the increase in size. Moreover, increasing the degree of integration further decreases the yield of the semiconductor chip. A defect relief circuit can be built in a semiconductor chip of a semiconductor memory device to increase the yield.

The defect relief circuit can make use of an Error Correction Code (ECC) to store main data and parity data generated within the semiconductor memory. A Hamming Code is an ECC that may be employed for digital communication to detect and correct errors using a parity bit.

ECCs have been increasingly applied to non-volatile memory devices requiring high reliability such as a mask Read Only Memory (ROM) or an Electrically Erasable and Programmable Read Only Memory (EEPROM).

Applying an ECC to a non-volatile memory device may cause an increase in chip size due to the addition of a parity cell or a speed delay on the error correction circuit. However, such applications may enhance reliability and yield.

FIG. 1 is a schematic block diagram of a conventional semiconductor memory device, which includes an address input buffer 10, a command decoder 12, a plurality of memory banks BA_A, BA_B, BA_C and BA_D, a plurality of row address decoders 20-1, 20-2, 20-3 and 20-4, a plurality of column address decoders 30-1, 30-2, 30-3 and 30-4, a data input buffer 40, a parity data generation unit 42, a data input driver 44, an output multiplexer 50, a data error detection and correction unit 52, and a data output buffer 54.

Each of the plurality of memory banks includes normal memory cells 60-1, 60-2, 60-3 and 60-4, and ECC memory cells 70-1, 70-2, 70-3 and 70-4. For ease of discussion, it is assumed that the plurality of memory banks are four memory banks BA_A, BA_B, BA_C and BA_D.

The address input buffer 10 receives and buffers an external address ADD in response to an active signal ACT and a clock signal PCLK during an active operation to generate an internal row address ra[14:0], and receives and buffers an external address ADD in response to a write signal WE or a read signal RE and a clock signal PCLK during a write or read operation to generate an internal column address ca[14:0].

The command decoder 12 receives a command signal CMD and decodes the command signal CMD in response to a clock signal PCLK to generate the active signal ACT, the write signal WE, and the read signal RE.

Each of the plurality of row address decoders 20-1, 20-2, 20-3 and 20-4 receives an internal row address ra[14:0] and an active signal ACT, and decodes the signals to activate one signal WL_A, WL_B, WL_C and WL_D among word selection signals of each of the four memory banks BA_A, BA_B, BA_C and BA_D.

Each of the plurality of column address decoders 30-1, 30-2, 30-3 and 30-4 receives and decodes the buffered internal column address ca[14:0] and the active signal ACT to activate one signal CSL_A, CSL_B, CSL_C and CSL_D among column selection signals of each of the four memory banks BA_A, BA_B, BA_C and BA_D.

Each of the memory banks BA_A, BA_B, BA_C and BA_D, in response to the data write signal WE or the data read signal RE, inputs normal data to the normal memory cells 60-1, 60-2, 60-3 and 60-4, or outputs the normal data from the normal data cells 60-1, 60-2, 60-3 and 60-4 and inputs parity data to the ECC memory cells 70-1, 70-2, 70-3 and 70-4, or outputs the parity data from the ECC memory cells 70-1, 70-2, 70-3 and 70-4.

The data input buffer 40 receives and buffers write data Di of N bits through data input and output pins in response to the write signal WE and the clock signal PCLK to output buffered write data.

The parity data generation unit 42 receives and encodes the write data buffered by the data input buffer 40 to generate parity data, thereby outputting normal write data of N bits and parity write data of M bits.

The output multiplexer 50 receives and multiplexes normal read data of N bits and parity read data of M bits from the plurality of memory banks in response to the data read signal RE, and then outputs them.

The data error detection and correction unit 52 receives and decodes the normal read data of N bits and the parity read data of M bits output from the output multiplexer 50, and then restores the normal read data and the parity read data to original read data of N bits to output them. The restored read data is subjected to a Hamming Code algorithm for detecting errors, and data with errors are corrected.

The data output buffer 54 receives read data of N bits from the data error detection and correction unit 52, and delays the read data by a predetermined time to output the buffered read data through the data input and output pins.

It is assumed that the plurality of word line selection signals are n bits, the plurality of column selection signals are m bits, and the write data Di and the read data Do are K serial data converted to/from parallel data of N bits.

When a row address ra[14:0] of 15 bits is externally applied with predetermined commands, the command decoder 12 internally generates an active command ACT, and the address input buffer 10 buffers a row address RA in response to a buffered clock signal PCLK to generate a buffered internal row address ra[14:0] of 15 bits.

Each of the plurality of row address decoders 20-1, 20-2, 20-3 and 20-4 decodes 13 bits ra[12:0] of the internal row address ra[14:0] to generate word line selection signals, so that one selection signal of the word line selection is signals is activated. Two most significant bits ra[14:13] are decoded as a bank address to select a memory bank. The combinations of the two most significant bits are '00', '01', '10', and '11', for respectively selecting corresponding banks BA_A, BA_B, BA_C and BA_D during a data write operation.

When a column address ca[14:0] of 15 bits is externally applied with predetermined commands, the command decoder 12 generates a write command WE, and the address input buffer 10 buffers a column address CA in response to the buffered clock signal PCLK to generate a buffered column address of 15 bits ca[14:0].

Each of the plurality of column address decoders 30-1, 30-2, 30-3 and 30-4 decodes 13 bits ca[12:0] of the buffered internal column address ca[14:0] to generate a plurality of column selection signals, so that one of the column selection signals is activated. In addition, two most significant bits ca[14:13] are decoded as a bank address to select the memory bank as in the plurality of row address decoders 20-1, 20-2, 20-3 and 20-4.

For example, when the applied bank address is "00", the first memory bank BA_A of the plurality of memory banks is selected.

The data input buffer 40 receives and buffers write data Di of N bits through data input and output pins in response to the write signal WE and the clock signal PCLK to output buffered write data.

The parity data generation unit 42 receives the write data of N bits buffered by the data input buffer 40 to generate and encode parity data. The parity data generation unit 42 then divides normal write data of N bits and parity write data of M bits to input the normal write data of N bits to the normal memory cell 60-1 of the first memory bank, and input the parity write data of M bits to the ECC memory cells 70-1, 70-2, 70-3 and 70-4 of the first memory bank.

The bank addresses, i.e., '01', '10', and '11', are respectively applied to select the second, third and fourth memory banks BA_B, BA_C and BA_D of the memory banks so that normal write data and parity write data are input to the normal memory cells 60-1, 60-2, 60-3 and 60-4 and the ECC memory cells 70-1, 70-2, 70-3 and 70-4 of the memory banks, respectively.

When a row address of 15 bits RA is externally applied with predetermined commands, an operation is carried out to activate one of the word line selection signals, and two most significant bits ca[14:13] are used as a bank address and then decoded to select the memory bank within the memory cell array.

When a column address of 15 bits CA is externally applied with predetermined commands, the command decoder 12 generates a read command RE, and the address input buffer 10 buffers the column address CA in response to the buffered clock signal PCLK to thereby generate a buffered internal column address of 15 bits ca[14:0].

Each of the plurality of column address decoders 30-1, 30-2, 30-3 and 30-4 decodes 13 bits ca[12:0] of the buffered internal column address ca[14:0] to generate column selection signals, so that one of the column selection signals is activated. Two most significant bits ca[12:0] are used as a bank address to select the memory bank within the memory cell array, as in the operation of the plurality of row address decoders 20-1, 20-2, 20-3 and 20-4.

For example, the first memory bank BA_A is selected among the memory banks when the bank address is '00', such as during a data write operation.

The output multiplexer 50 receives and multiplexes normal read data of N bits and parity read data of M bits from the first memory bank in response to the data read signal RE, and then outputs them.

The data error detection and correction unit 52 simultaneously receives and decodes the normal read data of N bits and the parity read data of M bits output from the output multiplexer 50 to restore the normal read data and the parity read data to original read data Do of N bits and output them. The restored read data Do is subjected to a Hamming Code algorithm for detecting and correcting errors.

The data output buffer 54 receives the read data of N bits from the data error detection and correction unit 52 and delays them by a predetermined time to output the buffered read data Do through data input and output pins The second to fourth memory banks BA_B, BA_C and BA_D are selected among the memory banks by respectively applying bank addresses such as '01', '10', and '11', so that normal read data and parity read data are output from the respective normal memory cells 60-1, 60-2, 60-3 and 60-4 and the respective ECC memory cells 70-1, 70-2, 70-3 and 70-4. The normal read data of N bits and the parity read data of M bits are multiplexed by the output multiplexer 50, and then subjected to a Hamming Code algorithm for detecting errors while the normal read data and the parity read data are decoded to the original read data Do of N bits, and data having errors is corrected by the data error detection and correction unit 52.

In a conventional semiconductor memory device, where an ECC memory cell is separately disposed in each memory bank, the effect of data error detection and correction may be significant. However, an overhead problem may be caused due to the addition in error detection and correction of all data.

In addition, the Soft Error Rate (SER) may increase due to a change in electrostatic capacitance of capacitors within the memory cell when the semiconductor memory device is exposed to various electromagnetic waves in its packaged state.

A defect relief circuit such as a redundant data error detection and correction circuit can be employed to improve the SER, however, the overhead is significantly increased due to the addition of error detection and correction circuits for all the data in a conventional semiconductor memory device having a conventional memory bank structure.

SUMMARY OF THE INVENTION

An exemplary embodiment of the invention provides a semiconductor memory device, which allocates a separate memory bank including memory cells for data error detection and correction, and selectively carries out data error detection and correction depending on whether data is important and reliability is weak before the semiconductor memory device is available on the market.

An exemplary embodiment of the present invention provides a semiconductor memory device that includes a memory cell array, a mode setting circuit, a parity data generation unit, and a data error detection and correction unit. The memory cell array has a plurality of first memory banks for storing normal data, and a predetermined number of second memory banks less than the number of the first memory banks for storing parity data according to control of a first flag signal. The mode setting circuit sets the first flag signal and a second flag signal controlling whether a separate memory bank is used to store the parity data in the second memory banks. The parity data generation unit receives normal write data during a write operation, generates parity data with respect to the normal write data in response to the second flag signal, and outputs the normal data and the parity data. The data error detection and correction unit receives normal read data and parity read data read from the memory cell array during a read operation, detects errors of the normal read data in response to the second flag signal, corrects the normal read data when the errors are detected, and outputs the corrected read data.

The semiconductor memory device may further include a plurality of address decoders and a command decoder. The plurality of address decoders accesses one of the first memory banks and one of the second memory banks in response to a row address and a column address. The command decoder receives external commands and decodes the commands to generate an active signal, a mode setting command signal, a write signal, and a read signal.

The semiconductor memory device may further include a normal data input driver, a parity data input driver, a normal output multiplexer, and a parity output multiplexer. The normal data input driver receives the normal data, delays the normal data by a predetermined time, and outputs the delayed normal data. The parity data input driver receives the parity data, delays the parity data by a predetermined time, and outputs the delayed parity data. The normal output multiplexer receives the normal read data stored in the first memory banks in response to the read signal, multiplexes the normal read data, and outputs the multiplexed normal read data. The parity output multiplexer receives the parity read data stored in the second memory banks in response to the read signal, multiplexes the parity read data, and outputs the multiplexed parity read data.

The semiconductor memory device may further include a data input buffer and a data output buffer. The data input buffer receives the write data in response to the write signal, buffers the write data, and outputs the buffered write data. The data output buffer receives the corrected read data, delays the read data by a predetermined time, and outputs the buffered read data.

The address decoders may access one of the first memory banks in response to predetermined bits of the row address and the column address, and access one of the second memory banks according to control of the first flag signal.

The predetermined bits may be a bank address from most significant bits of any one address of the row address and the column address.

The parity data generation unit may receive the normal write data of N bits, and converts the normal write data to encoded write data of N+M bits by encoding the normal write data of N bits and the parity data of M bits according to control of the second flag signal.

The data error detection and correction unit may simultaneously receive the normal read data of N bits and the parity read data of M bits as N+M bits, and decodes the normal read data and the parity read data according to control of the second flag signal to restore the normal read data and the parity read data.

The mode setting circuit may decode the row address in response to the mode setting command signal making a separate memory bank used depending on the importance of input and output data or reliability of the first memory banks to generate the first and second flag signals.

The mode setting circuit may receive a bank address and generate the first flag signal to access one memory bank of the second memory banks according to control of the mode setting command, generate the second flag signal for enabling data encoding when the mode setting command signal and the write signal are applied, and generate the second flag signal for enabling data decoding when the mode setting command signal and the read signal are applied.

An exemplary embodiment of the present invention provides a method of detecting and correcting data errors of a semiconductor memory device. The semiconductor memory device includes a memory cell array having a plurality of first memory banks for storing normal data and a predetermined number of second memory banks less than the number of the first memory banks for storing parity data according to control of a first flag signal. The method includes the steps of setting the first flag signal and a second flag signal controlling whether the second memory banks are separately used to store the parity data, receiving write data during a write operation, and generating and encoding parity data with respect to the write data in response to the second flag signal to output the normal data and the parity data, inputting and outputting the normal data to and from the first memory banks, and inputting and outputting the normal data and the parity data to and from the first memory banks and the second memory banks, respectively, when the parity data is generated, and receiving the output normal data and the output parity data in a read operation, detecting errors of the normal read data in response to the second flag signal, correcting the normal read data when the errors are detected, and outputting the corrected read data.

The method may further include steps of selecting addresses of the first memory banks during the inputting and outputting of the normal data, and selecting addresses of the first memory banks and the second memory banks during the inputting and outputting of the normal data and the parity data, and receiving and decoding external commands to generate an active signal, a mode setting command signal, a write signal, and a read signal.

Selecting the addresses may include steps of accessing one memory bank of the first memory banks in response to predetermined bits of a row address and a column address during the inputting and outputting of the normal data, and accessing one memory bank of the first memory banks and one memory bank of the second memory banks according to control of the first flag signal in response to the predetermined bits during the inputting and outputting of the normal data and the parity data.

The predetermined bits may be a bank address from most significant bits of any one address of the row address and the column address.

The method may further include steps of receiving the normal data, delaying the normal data by a predetermined time, and outputting the delayed normal data, receiving the parity data, delaying the parity data by a predetermined time, and outputting the delayed parity data, receiving the normal data stored in the first memory banks in response to the read signal, multiplexing the normal data, and outputting the multiplexed normal data, and receiving the parity data stored in the second memory banks in response to the read signal, multiplexing the parity data, and outputting the multiplexed parity data.

The method may further include steps of receiving and buffering the write data in response to the write signal, and outputting the buffered write data, and receiving the corrected read data, delaying the corrected read data by a predetermined time, and outputting the buffered read data.

Setting the flag signals may include decoding the row address in response to the mode setting command making a separate memory bank used depending on the importance of input and output data or the reliability of the first memory banks, and generating the first and second flag signals.

Setting the flag signals may include receiving a bank address to generate the first flag signal for accessing one memory bank of the second memory banks according to control of the mode setting command, generating the second flag signal for enabling data encoding when the mode setting command signal and the write signal are applied, and generating the second flag signal for enabling data decoding when the mode setting command signal and the read signal are applied.

DETAILED DESCRIPTION OF EXEMPLARY EMBODIMENTS

Hereinafter, exemplary embodiments of the present invention will be described in detail with reference to the accompanying drawings. This invention may, however, be embodied in different forms and should not be construed as limited to the embodiments set forth herein.

Figure 2A:
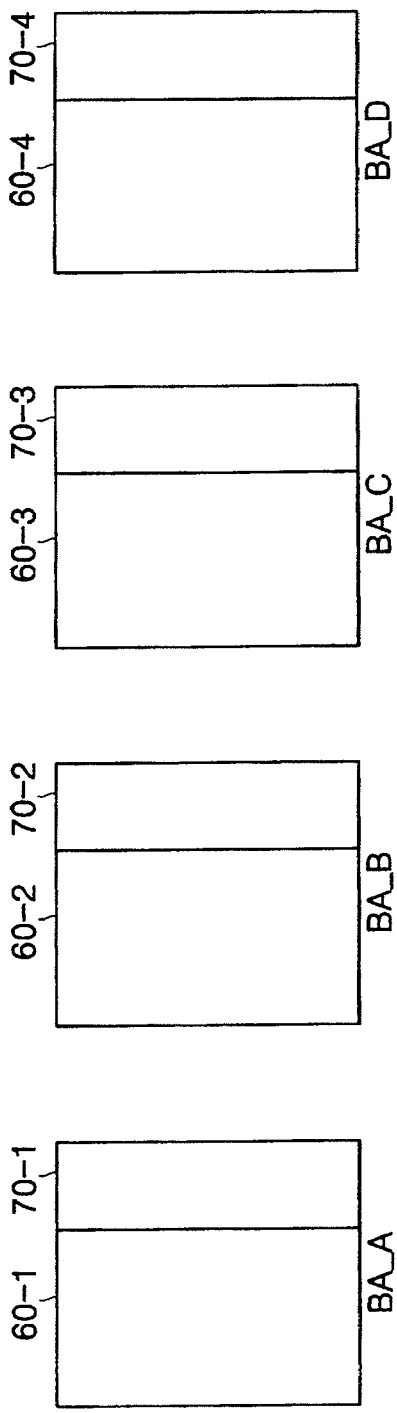
FIG. 2A is a configuration diagram of a memory cell array within a conventional semiconductor memory device.
Figure 2B:
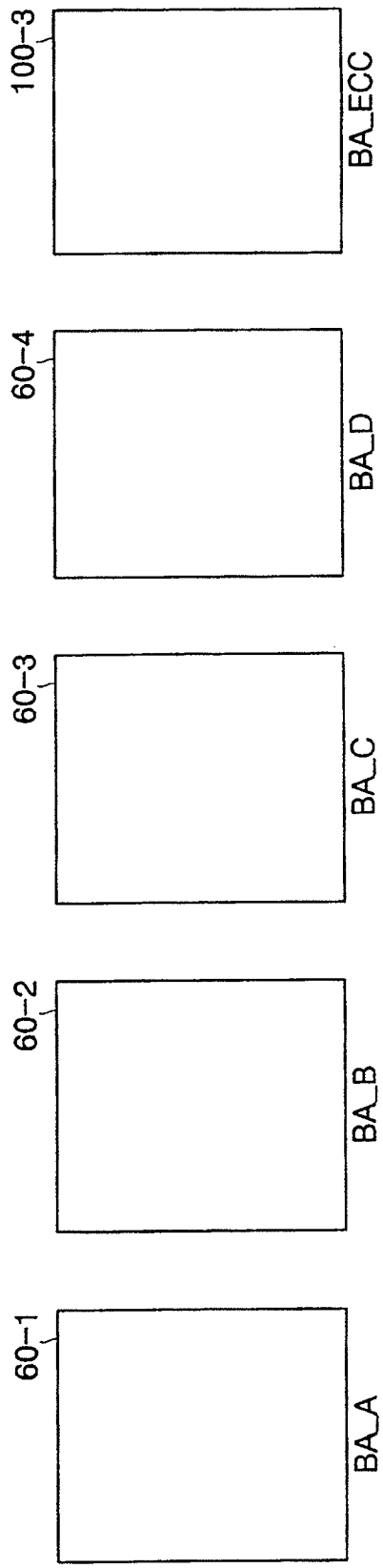
FIG. 2B is a configuration diagram of a memory cell array within a semiconductor memory device in accordance with an exemplary embodiment of the present invention.

FIG. 2A is a configuration diagram of a memory cell array within a conventional semiconductor memory device, and FIG. 2B is a configuration diagram of a memory cell array within a semiconductor memory device in accordance with an exemplary embodiment of the present invention.

Referring to FIG. 2A, the memory cell array within the conventional semiconductor memory device includes a plurality of memory banks BA_A, BA_B, BA_C and BA_D which include respective normal memory cells 60-1, 60-2, 60-3 and 60-4 and respective ECC memory cells 70-1, 70-2, 70-3 and 70-4. For ease of discussion, it is assumed that the memory cell array includes four memory banks.

Each of the memory banks BA_A, BA_B, BA_C and BA_D inputs normal data to the normal memory cells 60-1, 60-2, 60-3 and 60-4, or outputs the normal data from the normal memory cells 60-1, 60-2, 60-3 and 60-4, and inputs parity data generated from the normal data using a Hamming Code for detecting and correcting errors of the normal data to the ECC memory cells 70-1, 70-2, 70-3 and 70-4, or outputs the parity data from the ECC memory cells.

In contrast, referring to FIG. 2B, the memory cell array within the semiconductor memory device of the present exemplary embodiment includes a plurality of normal memory banks BA_A, BA_B, BA_C and BA_D and a plurality of ECC memory banks BA_ECC. The normal memory banks BA_A, BA_B, BA_C and BA_D include normal memory cells 60-1, 60-2, 60-3 and 60-4, respectively, and the ECC memory banks BA_ECC include ECC memory cells 70-1, 70-2, 70-3 and 70-4. As an example, and for ease of discussion, it is assumed that the memory cell array of the present exemplary embodiment includes four normal memory banks BA_A, BA_B, BA_C and BA_D and one ECC memory bank BA_ECC.

Normal data is input to each of the normal memory banks BA_A, BA_B, BA_C and BA_D or are output from each of the normal memory banks BA_A, BA_B, BA_C and BA_D, and parity data generated from the normal data using a Hamming Code for detecting and correcting errors of the normal data is input to the ECC memory bank BA_ECC or output from the ECC memory bank BA_ECC.

Techniques of allocating memory banks for detecting and correcting data errors in the semiconductor memory device of the present exemplary embodiment will be described with reference to FIG. 2B.

In a first technique, a user of the semiconductor memory device stores only important data in the ECC memory bank BA_ECC depending on whether input and output data are important or not, and the user separately allocates at least one ECC memory bank BA_ECC among a plurality of memory banks using a mode register setting signal.

In a second technique, a vendor of the semiconductor memory device allocates the ECC memory banks BA_ECC for only memory banks where reliability is weak. For example, in a code storage memory semiconductor device such as a NOR flash, the ECC memory banks BA_ECC may be allocated to an important function region such as a One Time Programmable (OTP) block or a booting region, and may be randomly allocated to the rest of the memory banks in a bank-free concept.

The OTP block is a block where programming can be carried out only once at a time, whereas a Multiple Time Programmable block allows the user to carry out programming and erasing several times.

Figure 3:
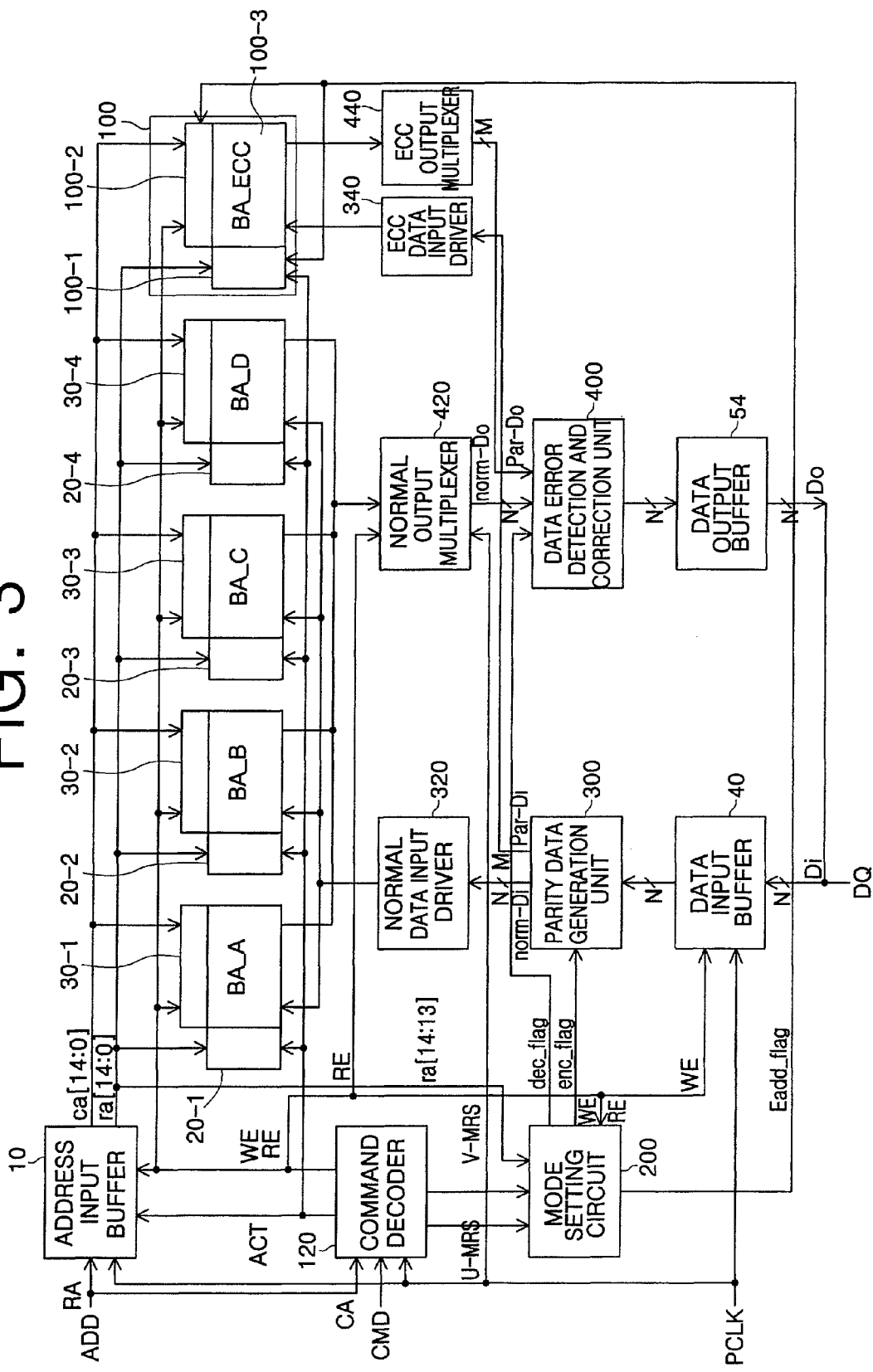
FIG. 3 is a schematic block diagram of a semiconductor memory device in accordance with an exemplary embodiment of the present invention.

FIG. 3 is a schematic block diagram of a semiconductor memory device which allocates a separate data error detection and correction memory bank in accordance with an exemplary embodiment of the present invention. The semiconductor memory device includes an address input buffer 10, a command decoder 120, a mode setting circuit 200, a plurality of normal memory banks BA_A, BA_B, BA_C and BA_D, an ECC memory bank BA_ECC, a plurality of row address decoders 20-1, 20-2, 20-3 and 20-4, a plurality of column address decoders 30-1, 30-2, 30-3 and 30-4, a normal data input driver 320, a normal output multiplexer 420, a normal output multiplexer 420, an ECC data input driver 340, an FCC output multiplexer 440, a parity data generation unit 300, a data error detection and correction unit 400, a data input buffer 40, and a data output buffer 54.

The ECC memory bank BA_ECC may be plural depending on the size of parity data to be stored, however it is assumed that the plurality of normal memory banks are four normal memory banks BA_A, BA_B, BA_C and BA_D, and the number of ECC memory bank is one for ease of understanding the present exemplary embodiment.

Functions of respective blocks of the semiconductor memory device will now be described with reference to FIG. 3.

Figure 1:
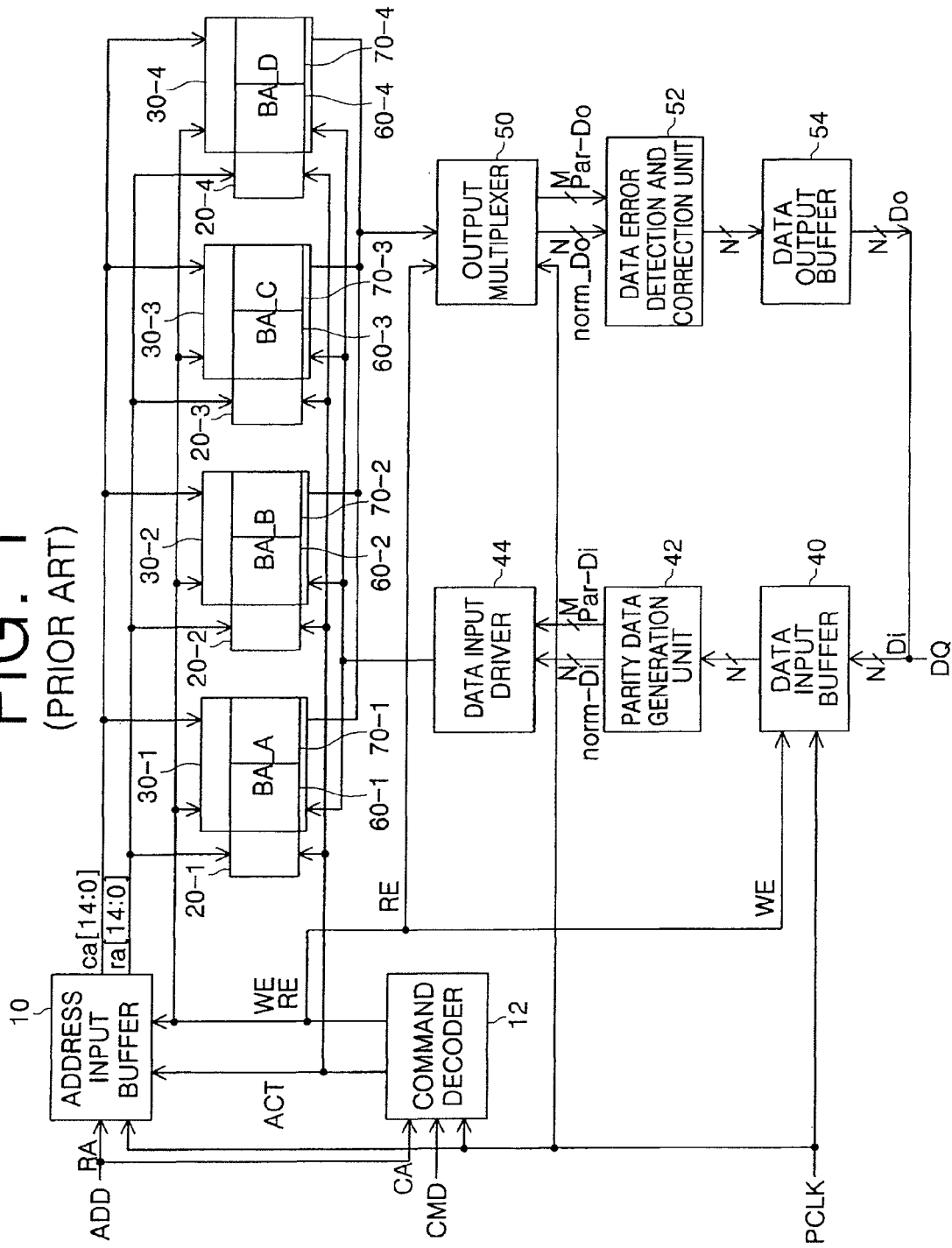
FIG. 1 is a schematic block diagram of a conventional semiconductor memory device.

Since the address input buffer 10, the plurality of row address decoders 20-1, 20-2, 20-3 and 20-4, the plurality of column address decoders 30-1, 30-2, 30-3 and 30-4, the normal data input driver 320, the normal output multiplexer 420, the data input buffer 40, and the data output buffer 54 have substantially the same function as the blocks of the conventional semiconductor memory device of FIG. 1, a detailed description thereof is omitted and only blocks having different functions will be described.

Normal memory banks BA_A, BA_B, BA_C and BA_D and separate ECC memory banks BA_ECC are independently configured within the memory cell array to allow normal data to be stored in normal memory cells 60-1, 60-2, 60-3 and 60-4 of the respective normal memory banks BA_A, BA_B, BA_C and BA_D and to allow ECC parity data to be stored in FCC memory cells 100-3 of the separate ECC memory bank BA_ECC. The data input driver for inputting and outputting the normal data is divided from the output multiplexer for inputting and outputting the ECC data.

In addition, the command decoder 120 not only generates an active signal ACT, a write signal WE, and a read signal RE, but also receives and decodes a command set by the vendor of the semiconductor memory device since a separate allocation is required for a command set by the user of the semiconductor memory depending on the importance of the input and output data or the memory banks having weak reliability, thereby outputting the mode setting command signal U_MRS of the user or the mode setting command signal V_MRS of the vendor.

The mode setting circuit 200 receives and decodes a row address RA, and controls opening and closing of built-in fuses and comparison operations of a comparator under the control of the mode setting command signal of the user U_MRS or the mode setting command signal of the vendor V_MRS, thereby generating an ECC address flag signal Eadd_flag, an encoding flag signal enc_flag, and a decoding flag signal dec_flag.

Figure 4:
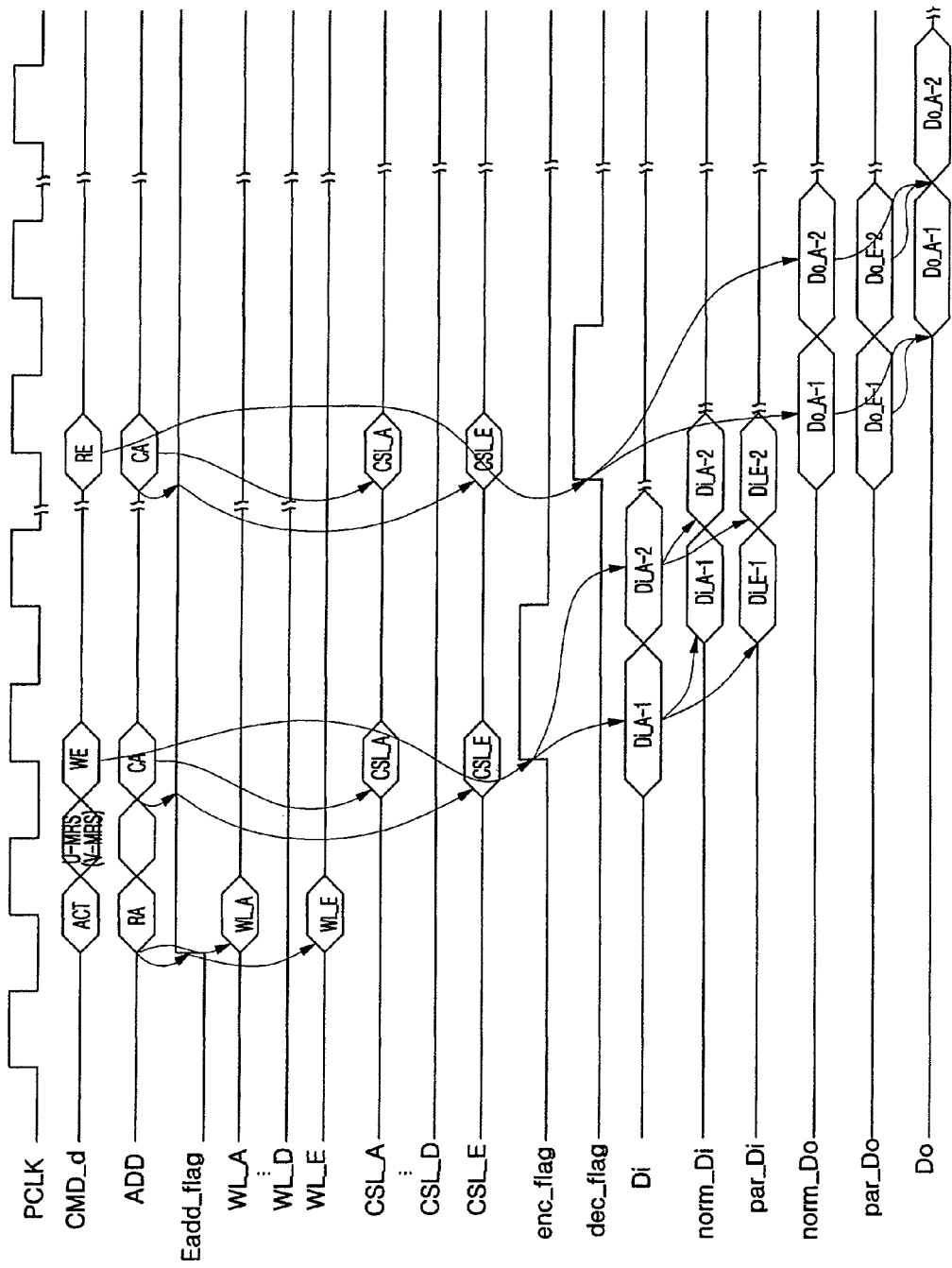
FIG. 4 is an operational timing diagram of the semiconductor memory device shown in FIG. 3.

FIG. 4 is an operational timing diagram for explaining operations of inputting and outputting data by allocating a memory bank for data error detection and correction of the semiconductor memory device shown in FIG. 3, which illustrates a clock signal PCLK, a decoded command signal CMD_d, an input address signal ADD, an ECC address flag signal Eadd_flag, a plurality of memory bank word line selection signals WL_A to WL_E, a plurality of memory bank column line selection signals CSL_A to CSL_E, an encoding flag signal enc_flag, a decoding flag signal dec_flag, a write data signal Di, a normal data input signal norm_Di, a parity data input signal par_Di, a normal data output signal norm_Do, a parity data output signal par_Do, and a read data signal Do.

The clock signal PCLK toggles at a constant phase and a constant period, and the active command ACT, the mode setting command U_MRS or V_MRS, a data write command WE, and a data read command RE are sequentially loaded as the decoded command signal CMD_d.

The input address signal ADD loads a row address RA through an address pin in response to the active command ACT, loads a column address CA for writing data in response to the data write command WE, and loads the column address CA for reading data in response to the data read command RE.

The first memory bank BA_A within the memory cell array may be selected by using two most significant bits ra[14:13] of the internal row address ra[14:0] as a bank address and applying and decoding "00" so that the word line selection signal WL_A of the corresponding memory bank is activated, and the first memory bank BA_A within the memory cell array may be selected by using two most significant bits ca[14:13] of the internal column address ca[14:0] as a bank address and applying and decoding "00" so that the column line selection signal CSL_A of the corresponding memory bank is activated.

The mode setting circuit 200 receives the row address RA to generate the EDD address flag signal Eadd_flag for activating the word line selection signal WL_E and the column line selection signal CSL_E of the ECC memory bank BA_ECC under the control of the mode setting commands U_MRS and V_MRS, respectively.

When the data write command WE is loaded, the encoding flag signal enc_flag transitions to a high level and then transitions to a low level after one period, and when the data read command RE is loaded, the decoding flag signal dec_flag transitions to a high level and then transitions to a low level after one period.

When the write data signal Di loads write data Di_A-1 to Di_A-K of the first memory bank through the data pin DQ and the encoding flag signal enc_flag transitions to a high level in response to the data write signal WE, the write data Di_A-1 to Di_A-K of the first memory bank loaded in the write data signal Di and parity write data Di_E-1 to Di_E-K of the write data Di_A-1 to Di_A-K are encoded and loaded as the normal data input signal norm_Di and the parity data input signal par_Di at a rising edge of the next clock, respectively.

In addition, when the decoding flag signal dec_flag transitions to a high level while the normal data output signal norm_Do and the parity data output signal par_Do load the normal read data Do_A-1 to Do_A-K and the parity read data Do_E-1 to Do_E-K of the respective normal read data Do_A-1 to Do_A-K in the first memory bank in response to the data read signal RE, the decoded read data Do_A-1 to Do_A-K of the first memory bank are output as the read data signal Do at the rising edge of the next clock.

Operations of a semiconductor memory device according to an exemplary embodiment of the present invention will now be described with reference to FIGS. 2 to 4.

When the allocation of the ECC memory bank BA_ECC of the plurality of memory banks within the memory cell array is finished, the parity data generation unit 300 or the data error detection and correction unit 400 carries out an ECC encoding operation when a write or read operation is carried out on the corresponding ECC memory bank BA_ECC.

Since operations generating the active command ACT and the data write command WE of the command decoder 120, and the internal row address ra[14:0] and the internal column address ca[14:0] of the plurality of column address decoders 30-1, 30-2, 30-3 and 30-4 are substantially the same as the data write operations of the conventional semiconductor memory device of FIG. 1, a detailed description thereof is omitted and only different operations will be described herein.

For example, when it is assumed that a user of a semiconductor memory device according to an exemplary embodiment of the present invention regards a first data as important and a second data as not important, and stores the first and second data together in the plurality of memory banks within the memory cell array, the user inputs a command in a mode register set form to the command decoder 120 to store parity bits of the first data in a separately allocated ECC memory bank BA_ECC and store normal data of the first data Di_A-1 to Di_A-K, and the second data, in the normal memory banks BA_A, BA_B, BA_C and BA_D.

Accordingly, the command decoder 120 outputs the mode setting command U_MRS of the user, and the mode setting circuit 200 receives the mode setting command U_MRS to output the encoding flag signal enc_flag of a high level.

The mode setting command U_MRS of the user is applied in a mode register set form, which controls opening and closing of fuses built in the mode setting circuit 200 and is compared with the bank address applied from the address input buffer 10 by a built-in comparator, thereby outputting the comparison result signal in the form of an encoding flag signal enc_flag.

The bank address is a combination of two most significant bits ra[14:13] of the internal row address ra[14:0], which matches four memory banks BA_A, BA_B, BA_C and BA_D in a one-to-one manner.

When the combinations of the two most significant bits ra[14:13] of the internal row address are '00', '01', '10', '11', the first memory bank BA_A, the second memory bank BA_B, the third memory bank BA_C, and the fourth memory bank BA_D are correspondingly matched and selected during the writing and reading of data.

The high-level encoding flag signal enc_flag is output when the mode setting command U_MRS of the user is applied to the mode setting circuit 200 and the more important first data is applied. The low-level encoding flag signal enc_flag is output when the less important second data is applied.

Accordingly, the parity data generation unit 300 carries out the ECC encoding operation only on the first data where the high-level encoding flag signal enc_flag is output and the data write command WE is applied, and does not carry out the ECC encoding operation on the second data where the low-level encoding flag signal enc_flag is output.

The parity data generation unit 300 receives the first and second data applied through the data input buffer 40, and generates and encodes parity data under the control of the encoding flag signal enc_flag, thereby outputting normal write data Di_A-1 to Di_A-K of N bits of the first data and parity write data Di_E-1 to Di_E-K of M bits of the first data. Accordingly, the input write data of N bits Di are encoded to normal data of N bits and parity data of M bits and then converted to encoding data of N+M bits to be output as the normal data input signal norm_Di and the parity data input signal par_Di, respectively.

The normal data input driver 320 receives the normal write data Di_A-1 to Di_A-K of N bits of the first data from the parity data generation unit 300, delays the normal write data by a predetermined time and outputs the delayed normal write data. The ECC data input driver 340 receives the parity write data Di_E-1 to Di_E-K of M bits of the first data, delays the parity write data by a predetermined time and outputs the delayed parity write data.

The memory cell array receives the normal write data of N bits of the first data delayed by the predetermined time from the normal data input driver 320 and the parity write data of M bits of the first data delayed by the predetermined time from the ECC data input driver 340, and then writes the normal write data and the parity write data to the first memory bank BA_A and the ECC memory bank BA_ECC, respectively.

In addition, when it is assumed that a third write data of the third memory bank BA_C has relatively weak reliability and a fourth write data of the fourth memory bank BA_D has relatively strong reliability, the vendor inputs commands to the command decoder 120 in a mode register set form, to store parity bits of the third data in a separately allocated ECC memory bank BA_ECC and store normal data of the third data and the fourth write data in normal memory banks BA_A, BA_B, BA_C and BA_D.

Accordingly, the command decoder 120 outputs the mode setting command V_MRS of the vendor, and the mode setting circuit 200 receives the mode setting command V_MRS of the vendor to output the high-level encoding flag signal enc_flag.

The mode setting command V_MRS of the vendor is applied in the mode register set form, and output in the form of an encoding flag signal in response to the internal operation of the mode setting circuit 200.

Accordingly, the parity data generation unit 300 carries out the ECC encoding operation only on the third data where the high-level encoding flag signal enc_flag is output and the data write command WE is applied, and does not carry out the ECC encoding operation on the fourth data where the low-level encoding flag signal enc_flag is output.

The parity data generation unit 300 receives the third and fourth data applied through the data input buffer 40, and generates and encodes parity data under the control of the encoding flag signal enc_flag, thereby outputting normal write data of N bits of the third data and parity write data of M bits of the third data. Accordingly, the input write data of N bits Di are encoded to normal data of N bits and parity data of M bits, and then converted to encoding data of N+M bits to be output as the normal data input signal norm_Di and the parity data input signal par_Di, respectively.

The normal data input driver 320 receives the normal write data of N bits of the third data from the parity data generation unit 300, delays the normal write data by a predetermined time and outputs the delayed normal write data, and the ECC data input driver 340 receives the parity write data of M bits of the third data, delays the parity write data by a predetermined time and outputs the delayed parity write data.

The memory cell array receives the normal write data of N bits of the third data delayed by the predetermined time from the normal data input driver 320 and the parity write data of M bits of the third data delayed by the predetermined time from the ECC data input driver 340, and then writes the normal write data and the parity write data to the third memory bank BA_C and the ECC memory bank BA_ECC, respectively.

Since operations generating the active command ACT and the data read command RE of the command decoder 120, and the internal row address ra[14:0] and the internal column address ca[14:0] of the plurality of column address decoders 30-1, 30-2, 30-3 and 30-4 are substantially the same as the data write operations of the conventional semiconductor memory device of FIGS. 1 and 2A, a detailed description thereof is omitted and only different operations will be described herein.

During a data write operation of the present exemplary embodiment, when it is assumed that the user of the semiconductor memory device has applied the mode setting command signal U_MRS to the mode setting circuit 200 based on the importance of the first and second data, the mode setting circuit 200 outputs the high-level decoding flag signal dec_flag in response to the data read command RE.

The normal output multiplexer 420 receives normal read data Do_A-1 to Do_A-K of the first data stored in the normal memory cells 60-1 of the first memory bank BA_A, and the ECC output multiplexer 440 receives parity read data Do_E-1 to Do_E-K of the first data stored in the ECC memory cells 100-3 of the ECC memory bank BA_ECC. Then the output multiplexers 420 and 440 multiplex the received data to the normal read data of N bits and the parity read data of M bits, respectively, thereby outputting them as a normal data output signal norm_Do and a parity data output signal par_Do, respectively.

The data error detection and correction unit 400 simultaneously receives, as N+M bits, the normal read data of N bits of the first data Do_A-1 to Do_A-K output from the normal output multiplexer 420 and the parity read data Do_E-1 to Do_E-K of M bits of the first data output from the ECC output multiplexer 440, decodes the normal read data and the parity read data under the control of the decoding flag signal dec_flag, detects errors using a general Hamming Code algorithm, and corrects the data where the errors are detected.

The data output buffer 54 receives the first read data of N bits from the data error detection and correction unit 400, delays the first read data by a predetermined time, and outputs the buffered first read data Do_A-1 to Do_A-K through the data pin DQ.

In addition, when it is assumed that third write data of the third memory bank BA_C has relatively weak reliability and fourth write data of the fourth memory bank BA_D has relatively strong reliability, the normal output multiplexer 420 receives the normal read data of the third data stored in the normal memory cells 60-3 of the third memory bank BA_C, and the ECC output multiplexer 440 receives the parity read data of the third data stored in the ECC memory cells 100-3 of the ECC memory bank BA_ECC. The output multiplexers 420 and 440 multiplex the received data to the normal read data of N bits and the parity read data of M bits, respectively, and then output them as a normal data output signal norm_Do and a parity data output signal par_Do, respectively.

The data error detection and correction unit 400 simultaneously receives, as N+M bits, the normal read data of the third data of N bits output from the normal output multiplexer 420 and the parity read data of M bits output from the ECC output multiplexer 440, decodes the normal read data and the parity read data under the control of the decoding flag signal dec_flag, detects errors using a general Hamming Code algorithm, and corrects the data where the errors are detected.

The data output buffer 54 receives the third read data of N bits from the data error detection and correction unit 400, delays the third read data by a predetermined time, and outputs the buffered third read data Do through the data input and output pin DQ.

When the mode setting command U_MRS or the mode setting command V_MRS is applied based on the mode register set in accordance with the importance of data, the ECC memory bank BA_ECC is selected.

Accordingly, during a data write operation, as in the first memory bank BA_A, the parity data generation unit 300 receives data to be stored in the second or fourth memory bank BA_B or BA_D applied through the data input buffer 40, encodes the data under the control of the encoding flag signal enc_flag, and converts the data to normal write data of N bits of each memory bank and parity write data of M bits.

In addition, the normal data input driver 320 and the ECC data input driver 340 receive the encoded write data to be stored in the second or fourth memory bank BA_B or BA_D from the parity data generation unit 300, and write them to the normal memory cells 60-2 and 60-4 of each memory bank and the ECC memory cells 100-3 of the ECC memory bank BA_ECC. During a data read operation, normal read data and parity read data of each memory bank are output from the normal memory cells 60-2 and 60-4 of the second or fourth memory bank BA_B or BA_D and the ECC memory cells 100-3 of the ECC memory bank BA_ECC, respectively, the normal output multiplexer 420 multiplexes the normal read data of N bits of each memory bank, and the ECC output multiplexer 440 multiplexes the parity read data of M bits of each memory bank.

The data error detection and correction unit 400 then receives the multiplexed read data norm_Do and par_Do from the normal output multiplexer 420 and the ECC output multiplexer 440, detects errors using a general Hamming Code algorithm while decoding them to original read data Do of the second or fourth memory bank of N bits under the control of the decoding flag signal dec_flag, corrects data where errors are detected, and outputs the corrected data.

According to at least one embodiment of the present invention, a memory bank for data error detection and correction of a semiconductor memory device is separately disposed and selectively carries out a data error detection and correction operation depending on the importance of data or whether reliability is weak or not, so that an overhead due to an addition in parity bits of all data can be minimized.

Having described exemplary embodiments of the present invention, it is to be understood that the invention is not limited to the disclosed embodiments, but, on the contrary, is intended to cover various modifications and equivalent arrangements included within the spirit and scope of the following claims.

What is claimed is:

1. A method of detecting and correcting data errors of a semiconductor memory device including a memory cell, the method comprising:
designating some memory cells of the semiconductor memory device as having a weak reliability;
setting a Mode Register Set signal to use an error checking and correction ECC function for the weak memory cells;
receiving write data in a write operation; and
generating and encoding parity data with respect to the write data in response to the Mode Register Set signal to output normal data and parity data.

2. The method of claim 1, wherein the parity data is output to at least one of the weak memory cells and the normal data is output to at least one other memory cell of the semiconductor device.

3. The method of claim 2, wherein the normal data is output through a data input driver of the device to the at least one other memory cell and the parity data is output through a multiplexer of the device to the at least one weak memory cell.

4. The method of claim 3, wherein a parity data generation unit of the device outputs the normal data to the data input driver and the parity data to the multiplexer.

5. The method of claim 1, wherein an encoding signal transitions to a first logic level in response to a command of the Mode Register Set signal, maintains the first logic level for one period of a clock signal, and afterwards transitions to a second logic level.

6. The method of claim 5, wherein the parity data is encoded at a rising edge of the clock signal after the encoding signal transitions to the first logic level.

7. The method of claim 5, wherein the clock signal toggles at a constant phase and a constant period.

8. A method of detecting and correcting data errors of a semiconductor memory device including a memory cell, the method comprising:
designating some memory cells of the semiconductor memory device as having weak reliability;
setting a Mode Register Set signal to use an error checking and correction ECC function for the weak memory cells;
receiving normal data and parity data in a read operation; and
detecting errors of the normal read data in response to the Mode Register Set signal, correcting the normal read data when the errors are detected, and outputting the corrected read data.

9. The method of claim 8, wherein the received parity data is received from at least one of the weak memory cells and the received normal data is received from another memory cell of the semiconductor memory device.

10. The method of claim 8, wherein a decoding signal transitions to a first logic level in response to a command of the Mode Register Set signal, and the detecting and correcting occurs after the transition.

11. The method of claim 10, wherein the decoding signal maintains the first logic level for one period of a clock signal, and afterwards transitions to a second logic level.

12. The method of claim 11, wherein the clock signal toggles at a constant phase and a constant period.

13. A method of operating a semiconductor memory device, the method comprising:
designating $1^{st}$ memory cells of the semiconductor device for a normal operation and $2^{nd}$ memory cells of the semiconductor memory device for an error checking and correction ECC function, wherein the $1^{st}$ memory cells and the $2^{nd}$ memory cells are controlled by a same external input command signal;

setting a Mode Register Set signal to prevent use of an ECC function on the $1^{st}$ memory cells;

receiving write data in a write operation, and storing the write data without parity data in response to the Mode Register Set signal to output normal data; and receiving the output normal data without outputting parity data in a read operation in response to the Mode Register Set signal.

14. The method of claim 13, wherein the write data is stored only within at least one of the $1^{st}$ memory cells and at least one of the $2^{nd}$ memory cells is for storing parity bits.

15. The method of claim 13, wherein a mode setting circuit of the device applies an encoding signal to a parity data generation unit of the device and a decoding signal to a data error detection and correction unit of the device in response to the Mode Register Set signal.

16. The method of claim 15, wherein the mode setting circuit maintains the encoding signal at a constant level to prevent generation of the parity data when the Mode Register Set signal is set to prevent use of the ECC function.

17. The method of claim 15, wherein the mode setting circuit maintains the decoding signal at a constant level to prevent use of the error detection and correction of the normal data when the Mode Register Set signal is set to prevent use of the ECC function.

18. The method of claim 15, wherein the command signal sequentially includes an command, a mode setting command, a data write command, and a data read command.

19. The method of claim 18, wherein the mode setting command controls opening and closing of fuses of the mode setting circuit.

20. The method of claim 18, wherein a row address is loaded in response to the active command, a column address is loaded for storing the write data in response to the data write command, and a column address is loaded for reading data in response to the data read command.

* * * * *